United States Patent [19]

French

[11] 4,080,074

[45] Mar. 21, 1978

[54] AUTOMATIC ZEROING CIRCUIT TO COMPENSATE FOR DARK CURRENTS OR THE LIKE

[75] Inventor: Park French, Aurora, Ohio

[73] Assignee: Sterndent Corporation, Mount Vernon, N.Y.

[21] Appl. No.: 698,143

[22] Filed: Jun. 21, 1976

[51] Int. Cl.² .................... G01J 3/50; H01J 39/12
[52] U.S. Cl. ...................... 356/188; 250/214 C
[58] Field of Search .............. 356/88, 89, 93–97, 356/179, 186, 188, 201–212, 218, 226; 250/214 C; 328/162, 165

[56] References Cited

U.S. PATENT DOCUMENTS

| | | | |
|---|---|---|---|
| 3,684,378 | 8/1972 | Lord | 356/97 |
| 3,861,788 | 1/1975 | Webster | 356/188 X |

Primary Examiner—F. L. Evans
Attorney, Agent, or Firm—Maky, Renner, Otto & Boisselle

[57] ABSTRACT

An automatic zeroing circuit normalizes a detector-measuring apparatus to eliminate relatively steady-state DC errors that may develop in response to the temperature or other variable parameter dependency of leakage currents in a transducer, such as dark currents in a photosensitive transistor. Therefore, the outputs from such apparatus are generally insensitive to such variables and errors.

15 Claims, 5 Drawing Figures

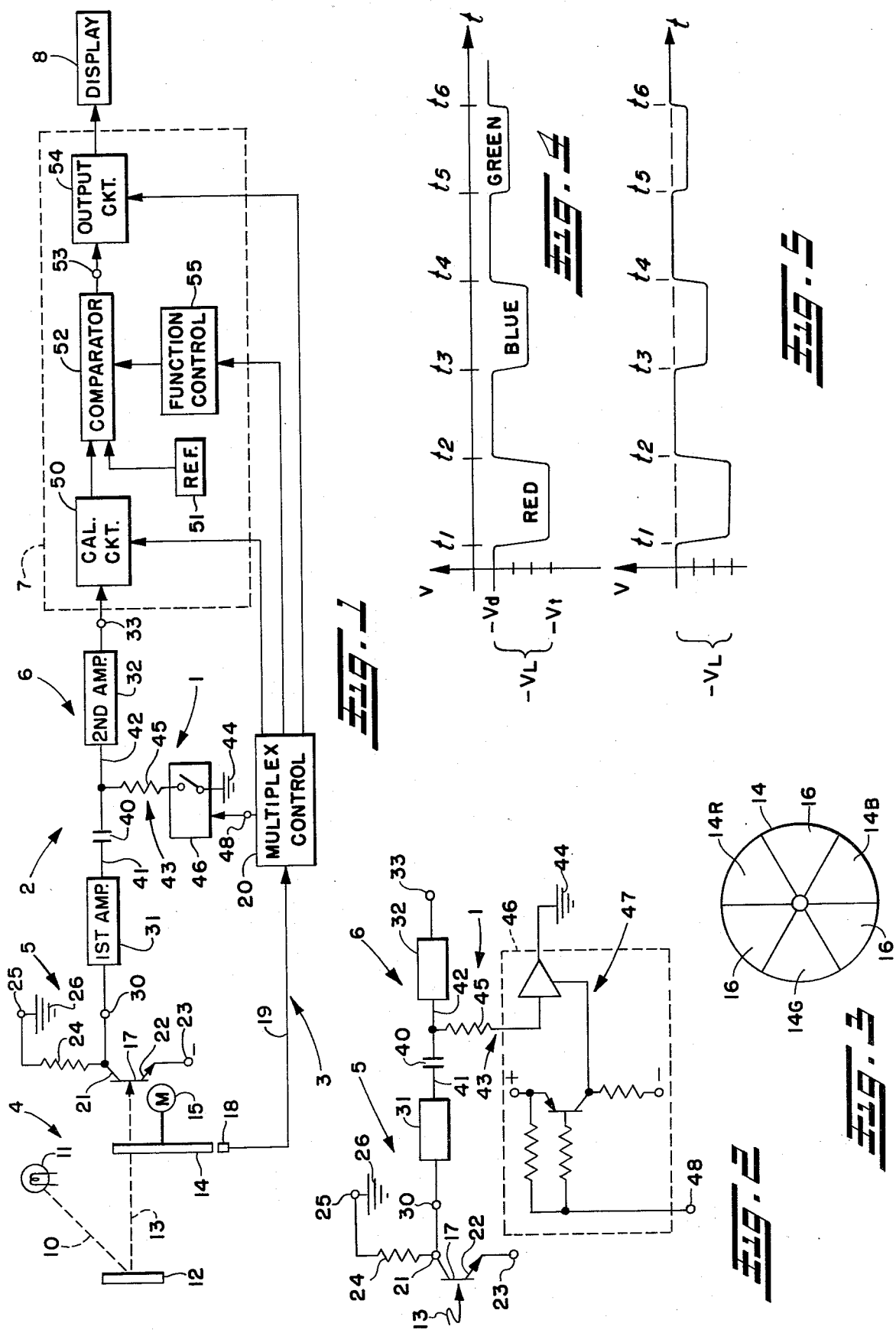

AUTOMATIC ZEROING CIRCUIT TO COMPENSATE FOR DARK CURRENTS OR THE LIKE

BACKGROUND OF THE INVENTION

The present invention generally relates to automatic calibrating or normalizing circuits and, more particularly, to an automatic zeroing circuit that eliminates the effect of dark currents encountered in photometric measuring equipment or similar effects experienced in the electrical output characteristics of transducers other than of the photometric type and detector circuits associated therewith.

A typical apparatus that converts an input, which is sensed by a transducer, to a quantified useful output, either in the form of a visual display or a control signal to a further apparatus, will usually include a transducer, a pre-amplifier detector circuit, a measuring circuit, and an output circuit. Although many types of transducers are known, such as photosensitive detectors, strain gauges, and the like that will produce an electrical signal in response to a sensed input, such as light, mechanical strain, or the like, the present application will present an example of the invention as employed in a colorimeter apparatus. However, it will be understood that the principles of the automatic zeroing circuit of the invention may be similarly employed in other similar detector and measuring systems.

The pre-amplifier detector circuit will amplify the electrical signal of the transducer and will provide an amplified signal output that is electrically measured, for example, in a differential amplifier, in a dual slope integrator, or other electrical measuring equipment. The measured output of such measuring circuitry is provided via the output circuit for display, automatic control, or like purposes. Calibration and other conventional circuits also may be included in such electrical apparatus.

A problem encountered with such detector and measuring systems is that the transducers in their respective circuits usually will produce an electrical signal, such as a leakage current, even when no measurable input is provided thereto. For example, a phototransistor type transducer will have a dark current therethrough even though no light is impinging thereon. Since the measuring portions of such systems are often of the comparator type, they are sensitive to the relatively steady-state or DC errors encountered due, for example, to such dark currents. Moreover, simple calibration of the measuring portion is unsatisfactory to correct for such errors, for leakage current usually is not fixed for a given transducer; rather, the leakage current, such as the dark current of a typical phototransistor, for example, will actually vary as a function of temperature and possibly of other variable parameters, such as aging, etc.

One non-limiting exemplary type of apparatus with which the automatic zeroing circuit of the invention may be employed is disclosed in U.S. patent application Ser. No. 499,479, filed Aug. 22, 1974, now U.S. Pat. No. 3,986,777, for "Tristimulus Colorimeter and Method of Using the Same for Fabrication of Artificial Teeth or the Like". This U.S. patent application is assigned to the same assignee as the present application. To the extent that it may be necessary to facilitate understanding of the present invention, the disclosure of the referenced patent application is incorporated herein.

In such colorimeter, the red, blue and green components of light reflected from an illuminated sample are sequentially and cyclically detected by a photosensitive diode transducer, and the electrical output of that transducer, which has operating electric potentials provided thereto, is amplified in a pre-amplifier detector circuit. A multiplex control responsive to the particular color of light being detected by the transducer at any given time, as determined by the particular position of a rotating color filter wheel, selectively operatively couples respective red, blue and green calibration circuits in the colorimeter and after calibration the respective amplified signals from the pre-amplifier detector circuit are measured in a dual slope integrator circuit type of comparator with respect to a reference electrical potential provided from a zener diode regulated power supply. The multiplex control, moreover, selectively, sequentially, and cyclically controls the delivery of the measured output signals from the dual slope integrator measuring circuit as digital signals to respective output circuits for the red, blue and green colors, which in turn supply the digital signals to respective displays for displaying in digital form the values of the respective color lights detected by the transducer.

SUMMARY OF THE INVENTION

The automatic zeroing circuit in accordance with the present invention automatically normalizes a pre-amplifier detector circuit of such detector and measuring systems with respect to a predetermined valve when the transducer of such a system is receiving an input of a relatively corresponding predetermined value. In the described embodiment of the automatic zeroing circuit as employed in the colorimeter of the referenced patent application, such circuit calibrates the pre-amplifier detector circuit in the colorimeter so that the effect of dark current, leakage current or the like and the variation in the same with respect to temperature or other parameter is reduced and/or eliminated. Therefore in the exemplary embodiment when zero light is impinging on the transducer, which may be a photosensitive transistor, the output signal from the pre-amplifier detector circuit also will be at a zero voltage level regardless of the actual dark current through the transducer. Thus, the measuring circuit portion is made effectively insensitive to such steady-state DC errors due to dark currents or the like and the displayed outputs of the colorimeter will be maintained accurate.

In a preferred embodiment of the invention the automatic zeroing circuit includes a capacitor coupling between the output of a first amplifier stage and the input of a second amplifier stage in a pre-amplifier detector circuit, which normally amplifies the electrical signal from a photosensitive transducer in response to a light input to the latter to provide an amplified signal generally proportionally representative of the intensity of that light input. The output signal from the first amplifier stage in response to the dark current in the transducer is normally a steady state DC current that is blocked from the input of the second amplifier stage by the capacitor. The automatic zeroing circuit also includes a discharge circuit coupled between the output side of the capacitor and the input to the second amplifier stage, and the discharge circuit is selectively cyclically closed to discharge the capacitor whenever the light input to the transducer is blocked, for example, by light blocking portions on the rotating color filter wheel. By so discharging the capacitor, for example, to a reference potential of, say, zero volts, the output from the second amplifier stage will also go to a predetermined level of, for example, also zero volts regardless of the dark current flow in the transducer. During such dark time of the transducer, the input side of the capacitor, which is connected to the output of the first amplifier stage, will remain at a potential determined by the dark current flow while the output side of the capacitor remains at the reference potential; and, later, when light is permitted to impinge onto the transducer causing the output of the first amplifier stage to jump relatively rapidly to a higher or lower, as the case may be, voltage level relative to that steady-state level, the output side of the capacitor will jump an amount equal to the differential change at the input side thereof. Accordingly, the amplified signal from the second amplifier stage of the pre-amplifier detector circuit will vary, for example, from zero volts when zero light impinges on the transducer to another higher or lower voltage level, as the case may be, proportionally representative of the intensity of the light impinging on the transducer. The automatic operation of the automatic zeroing circuit of the invention may be readily effected in the colorimeter apparatus, for example, of the above patent application using an electronic bilateral gate switch mechanism that closes and opens the discharge circuit in response to command signals from the multiplex control of the colorimeter.

With the foregoing in mind, it is a primary object of the invention to normalize or to calibrate automatically a detector circuit to a zero or other predetermined level with respect to a relatively corresponding predetermined input, such as a zero input, to a transducer coupled to such detector circuit.

Another object is to normalize a detector circuit to a zero level when a zero light input is supplied to a photosensitive transducer, thereby compensating for dark current or the like.

A further object of the invention is to effect the foregoing normalization and/or calibration automatically and cyclically in accordance with automatic cyclical operation of such transducer, detector circuitry and system employing the same, such as a colorimeter apparatus or the like.

An additional object is to improve the accuracy of measurements by transducer detector and electrical measuring apparatus.

These and other objects and advantages of the present invention will become more apparent as the following description proceeds.

To the accomplishment of the foregoing and related ends, the invention, then, comprises the features hereinafter fully described and particularly pointed out in the claims, the following description and the annexed drawing setting forth in detail a certain illustrative embodiment of the invention, this being indicative, however, of but one of the various ways in which the principles of the invention may be employed.

BRIEF DESCRIPTION OF THE DRAWING

In the annexed drawing:

FIG. 1 is a schematic electric circuit diagram, partly in block form, illustrating an automatic zeroing circuit in accordance with the invention as employed in a colorimeter apparatus;

FIG. 2 is a schematic electric circuit diagram of the automatic zeroing circuit of FIG. 1 showing the electronic bilateral gate switch in the discharge circuit thereof;

FIG. 3 is a schematic representation of a color filter wheel for use in the colorimeter apparatus of FIG. 1;

FIG. 4 is a graphical representation of the voltage output from the pre-amplifier detector circuit in the colorimeter apparatus of FIG. 1 showing the effect of dark current in the transducer thereof;

FIG. 5 is a graphical representation of the normalized voltage output from the amplifier detector circuit employing the automatic zeroing circuit of the invention, as depicted in FIGS. 1 and 2.

DESCRIPTION OF THE PREFERRED EMBODIMENT

Referring now more particularly to the drawing, wherein like reference numerals designate like parts in the several figures, an automatic zeroing circuit in accordance with the invention is generally designated at 1 included as a part of the electrical circuit 2 of a colorimeter apparatus 3, which may be similar in construction and operation to the colorimeter described in the reference patent application. Such colorimeter apparatus 3 includes an optics portion 4 and the indicated electrical circuit 2, and the latter, in particular, includes a transducer portion 5, a pre-amplifier detector circuit portion 6 to which the automatic zeroing circuit 1 is specifically coupled, a measuring circuit portion 7, and a visual display 8. Although the various portions of the colorimeter apparatus 3 are described in detail in the referenced patent application, their construction and operation will be summarily described below in order to facilitate an understanding of the automatic zeroing circuit 1 with relation thereto.

In the optics portion 4 incident light in a path 10 from a conventional light source 11, which produces a light output preferably in the visible spectrum or outside the visible spectrum, if desired, illuminates a sample 12, the color of which is to be determined by the colorimeter apparatus, and reflected light in a path 13 from the sample is divided into its red, blue, and green color components selectively, sequentially, and cyclically by the three color filters 14R, 14B, 14G of a conventional color filter wheel 14, which is shown schematically in FIG. 3. The color filter wheel 14 is rotated by a motor 15 to place the respective color filters or pie-shape light blocking portions 16 in the path of the reflected light 13 between the sample 12 and a conventional photosensitive transistor 17 in the transducer portion 5. A conventional mechanical, electrooptical or other pickup 18 is positioned relative to the color filter wheel 14 to detect the particular angular position of the latter and to provide a signal indicative thereof via a connection 19 to a multiplex control 20, which controls the multiplexed operation of the measuring circuit portions 7 of the electrical circuit 2, for example, to insert respective red, blue, and green calibrating circuits in operative connection in the measuring circuit, to direct the respective red, blue and green light intensity values for display by respective displays, etc., generally in the manner described in the referenced patent application.

The photosensitive transistor 17 in the transducer portion 5 has a collector 21 and an emitter 22, the impedance between which is generally a function of the intensity of the light impinging on the photosensitive transistor. The emitter 22 is connected at a terminal 23 to a source of relative negative potential, not shown, and the collector 21 is connected via a resistor 24 and a terminal 25 to a source of relative positive potential, such as the relative ground connection 26 illustrated. The magnitude of the resistance of the resistor 24 may be relatively large, for example, on the order of one megohm to develop adequate signal voltages from the currents through the photosensitive transistor 17, and the maximum impedance between the collector 21 and the emitter 22 of the photosensitive transistor 17, even when the latter is dark or, in other words, receiving a zero light input, will normally be of a finite value, which value is often a function of the temperature of the photosensitive transistor. Therefore, when a zero light input is received by the photosensitive transistor 17, a dark current or leakage current of relatively small value will flow between the terminals 25 and 23, and the actual magnitude of the dark current will be a function of the temperature of the photosensitive transistor. If desired other well known photosensitive transducers may be equivalently substituted for the photosensitive transistor 17.

In the exemplary colorimeter apparatus 3, assuming that the optics portion 4 and the photosensitive transistor 17 are maintained in a light-free environment, for example, and that the incident light 10 and reflected light 13 only pass in their indicated light paths, such dark current will flow in the transducer portion 5 when any one of the respective light blocking portions 16 of the color filter wheel 14 blocks the reflected light 13 from impinging on the photosensitive transistor; the potential at the collector 21 during such dark period of the photosensitive transistor 17 will be a function of the dark current and the resistance of the resistor 24. Moreover, the current flowing through the transducer portion 5 and, thus, the potential at the collector 21 when light is impinging on the photosensitive transistor 17 will be approximately a linear proportional function of the intensity of the impinging light. However, this latter light-responsive current flow is effectively additive with the dark current flow so that the actual current flowing in the transducer portion 5 in response to a given intensity light impinging on the photosensitive transistor 17 will be the sum of the light-responsive current flow and the dark current flow. Accordingly, the electrical signal produced by the transducer portion 5, particularly at the collector 21, in the form of an electrical potential supplied to the input 30 of the pre-amplifier detector circuit portion 6 will be a function of the dark current, which varies with the temperature of the photosensitive transistor 17, when the photosensitive transistor receives a zero light input, and will be a function of the sum of the dark current and the light-responsive current, when light impinges on the photosensitive transistor.

In the pre-amplifier detector circuit portions 6 first and second amplifier stages 31, 32 amplify the electrical signal supplied on the input 30 from the transducer portion 5 to provide an amplified signal at the terminal 33, which is coupled to the input of the measuring circuit portion 7. The amplifier stages 31, 32 may be conventional transistor amplifiers or other amplifier circuits with various feedback circuits and the like, as desired, having high input resistance values, for example, 10 megohms or more, and with sufficient gain to provide an amplified signal at the terminal 33 of a suitable magnitude for convenient measuring by the measuring circuit portion 7. To simplify the following description, the gain of the second amplifier stage will be considered to be unity, although it may have other gains, if desired.

The automatic zeroing circuit 1 is directly connected between the two amplifier stages 31, 32 of the pre-amplifier detector circuit portion 6. More particularly, the automatic zeroing circuit 1 includes a capacitor 40, which has an input side 41 coupled directly to the output of the first amplifier stage 31 and an output side 42 coupled directly to the input portion of the second amplifier stage 32, thereby effecting capacitive coupling of the two amplifier stages, and a discharge circuit 43 coupled to the capacitor output side 42 for selectively discharging the same to a predetermined potential, for example, relative ground potential, as is indicated at the ground connection 44, under command of the multiplex control 20 whenever one of the light blocking portions 16 of the color filter wheel 14 blocks light from impinging on the photosensitive transistor 17. The discharge circuit 43, more particularly, includes a resistor 45 and a switch 46, which is more comprehensively illustrated in FIG. 2 as a conventional electronic bilateral gate switch mechanism 47 that is normally open and may be selectively closed to complete connection of the resistor 45 to the ground connection 44 when a suitable control signal is supplied to the terminal 48 from the multiplex control 20.

The capacitor 40 is of a size that is satisfactory to block the relatively steady-state DC output of the first amplifier stage 31 in response to the relatively steady-state DC dark current in the transducer portion 5 from passing through to the second amplifier stage 32 while, on the other hand, readily permitting the relatively time varying output of the first amplifier stage 31 produced in response to the light-responsive current in the transducer portion 5 to pass on to the second amplifier stage 32. A suitable value of the capacitor 40 may be on the order of about one microfarad, for example. Moreover, the magnitude of the resistor 45 in the discharge circuit 43 should be sufficiently large to avoid large surge currents whenever the capacitor 40 is discharged upon closure of the switch 46 and should be sufficiently small so that the time constant of the RC circuit of the resistor and the capacitor 40 is sufficiently small so that the capacitor will be substantially fully discharged while the switch 46 is closed and preferably relatively promptly after such closure. A typical non-limiting value of the resistance of the resistor 45 may be on the order of about 10K ohms.

A graph of the amplified signal appearing at the terminal 33, assuming the automatic zeroing circuit 1 were not included in a pre-amplifier detector circuit portion 6 whereby the two amplifier stages 31, 32 would be directly connected, is shown in FIG. 4. Such amplified signal is depicted as a voltage that would have a magnitude $-V_d$ before time $t_1$ during which a light blocking portion 16 of the color filter wheel 14 is blocking light from impinging on the photosensitive transistor 17, so that $-V_d$ actually represents the voltage at the terminal 33 effected in response to dark current in the transducer portion 5. Later, at and shortly after time $t_1$ on the graph of FIG. 4 one of the color filters, say the color filter 14R of the color filter wheel 14, permits the red component of the reflected light 13 to impinge on the photosensitive transistor 17, which causes the voltage at the collector 21 to drop, i.e. toward a more negative value although actually increasing in absolute magnitude, thereby causing a corresponding drop in the voltage of the amplified signal at the terminal 33, thus bringing the voltage at that terminal down to a level $-V_r$. The actual change in the voltage of the amplified signal at the terminal 33, therefore, in response to the given intensity of red light impinging on the photosensitive transistor 17 causing a light-responsive current flow in the transducer portion 5 between the times $t_1$ and $t_2$ is indicated on the graph of FIG. 4 as voltage $-V_L$ which is the difference between the two voltages $-V_d$ and $-V_p$ the latter actually being the total voltage sum of $-V_d$ and $-V_L$. Between times $t_2$ and $t_3$ and between times $t_4$ and $t_5$ on the graph of FIG. 4 voltage $-V_d$ at the terminal 33 is shown since a respective light blocking portion 16 of the color filter wheel 14 would then be aligned to block light from impinging on the photosensitive transistor 17. Further, between times $t_3$ and $t_4$ and between times $t_5$ and $t_6$ the blue and green color filters 14B, 14G, respectively, are aligned to pass the respective blue and green components of the reflected light 13 to impinge on the photosensitive transistor 17 to effect amplified signal voltages at the terminal 33, as indicated, for example, on the graph of FIG. 4. It is emphasized here again that the actual value of the dark current produced amplified signal voltage $-V_d$ at the terminal 33 will vary with respect to the temperature of the photosensitive transistor 17 and/or with respect to other variable parameters, such as aging or the like thereof, and, therefore, the actual magnitude of the voltage $-V_t$ will correspondingly vary.

In the measuring circuit portion 7, the amplified signal voltage appearing at the terminal 33 is first calibrated by a respective red, blue or green calibration circuit in a calibrating circuit 50, as controlled by the multiplex control 20, and is then measured with respect to a reference voltage, which may be generated by a conventional zener diode regulated reference voltage generator 51. Such relative or comparison measurement may be effected in a dual slope integrator digital voltmeter circuit comparator 52 that produces a digital signal on its output 53, and that digital signal is supplied to an output circuit 54, which delivers respective signals to a conventional display 8 for visually indicating the magnitudes of the different respective colors of the sample 12 as detected by the photosensitive transistor 17. The multiplex control 20 assures that the proper respective digital signals are directed to appropriate red, blue and green displays in the display 8, depending on the color light being detected and then measured at any given time.

Associated with the comparator 52 in the measuring circuit portion 7 is a function control 55, which is synchronized by the multiplex control 20 to the color filter wheel 14, and it is the purpose of the function control 55 to operate the comparator 52 so that the latter first integrates for a period of time the voltage supplied from the calibrating circuit 50 and then from that integrated voltage level point integrates in an opposite direction the reference voltage from the reference voltage generator 51. The comparator 52 subsequently produces its digital signal output to the output circuit 54 representative of the time required for the latter integration to bring the integrated voltage level down to a predetermined level of, for example, zero volts. Moreover, the latter integration may be effected normally when a light blocking portion 16 of the color filter wheel 14 blocks light from the photosensitive transistor 13. As was mentioned above, the detailed operation of the measuring circuit portion 7 is presented in the referenced patent application. Furthermore, it will be understood that although one form of comparison-type measuring circuit portion 7 has been described herein, other types of comparison circuits, such as differential amplifier circuits or the like, may be employed to compare the amplified signal voltage from the pre-amplifier detector circuit portion 6 and the reference voltage.

In view of the foregoing description it will be clear that the absolute magnitude of the amplified signal voltage appearing at the terminal 33 is the one that is actually measured and compared in the measuring circuit portion 7, and the temperature-dependent portion of that amplified signal voltage, of course, is included in the absolute value thereof. Therefore, the measuring circuit 7 will normally be sensitive to the relatively steady-state DC errors caused by dark currents in the photosensitive transistor, for, as the temperature of the photosensitive transistor 17 or its other dark current varying parameter changes, the magnitude of the amplified signal voltage at the terminal 33 also would change, thereby to cause the display 8, for example, to display a magnitude or color value that is not accurately indicative of the intensity of the light actually impinging on the photosensitive transistor 17. It is the function of the automatic zeroing circuit 1 to normalize the pre-amplifier detector circuit portion 6 to block such DC errors and thereby to make the measuring circuit portion 7 effectively insensitive to those errors.

In the following description, now, it will be assumed that the automatic zeroing circuit 1 is coupled in the pre-amplifier detector circuit portion 6. The capacitor 40 blocks the steady-state output of the first amplifier stage 31 caused by the dark current in the transducer portion 5 from reaching the second amplifier stage 32. During the dark time, i.e. when a light blocking portion 16 of the color filter wheel 14 blocks light from impinging on the photosensitive transistor 17, the pickup 18 detects such alignment of the color filter wheel and commands the multiplex control 20 in turn to command closure of the switch 46 to effect discharge of the capacitor 40 to the predetermined reference potential, in this case the ground potential at the connection 44. Therefore, assuming that the second amplifier stage 32 has a gain of one, for example, the input side 41 of the capacitor 40 will be drawn to a value $-V_d$ of FIG. 4 when the output side 42 is drawn to ground potential. However, when any one of the color filters, say the red color filter 14R, of the color filter wheel 14 passes light to the photosensitive transistor 17, the pickup 18 detects such alignment of the color filter wheel and indicates the same to the multiplex control 20, whereby the latter commands the opening of the switch 46 in the discharge circuit 43 of the automatic zeroing circuit 1.

Moreover, the relatively sharp increase in the current through the transducer portion 5 due to the impinging light and the correspondingly sharp change in voltage at the collector 21 will cause the first amplifier 31 to produce an output signal that draws the input side 41 of the capacitor 40 to a voltage $-V_p$ as in FIG. 4; however, since there is already a potential difference of $-V_d$ between the input and output sides of the capacitor 40, the output side 42 goes only to a magnitude of $-V_L$. Since the gain of the second amplifier stage 32 is unity, the amplified signal voltage at the terminal 33 also becomes the voltage $-V_L$, as is clearly illustrated in the graph of FIG. 5. Therefore, the amplified signal voltage measured by the measuring circuit portion 7 will be independent of the temperature varying dark current and will be accurately proportionally representative of the intensity of the light impinging on the photosensitive transistor 17.

Similar operation of the colorimeter apparatus 3, including the automatic zeroing circuit 1 to correct substantially DC errors due, for example, to temperature dependency and the like, will occur as the colorimeter measures each of the colors components of reflected, or, if desired, transmitted light from the sample 12 thereby to display the color values in the display 8 accurately representing the color of the sample.

It should now be clear that each time the switch 46 is closed, the output from the first amplifier stage 31 that is provided to the input side 41 of the capacitor 40 is actually normalized relative to the input to the second amplifier stage 32 thereby to eliminate much or all of the relatively steady-state DC error in the colorimeter 3 or in another similar system due to temperature dependence of the photosensitive transistor or other transducer in its dark current or similar leakage current characteristic. Since closure of the switch 46 is effected whenever a zero light level condition is effected at the photosensitive transistor 17, the DC input level to the second amplifier stage 32 is actually normalized to zero volts so that its input and preferably its output, as well, become zero volts at such zero light level condition.

The embodiments of the invention in which an exclusive property or privilege is claimed are defined as follows:

1. In combination with a transducer for producing a quantifiable electrical signal generally proportionally representative of an input thereto, a detector circuit for amplifying such electrical signal to provide an amplified signal proportionally representative of such electrical signal, and a measuring circuit for measuring such amplified signal to provide an output signal indicative of such input to the transducer, the improvement comprising:
   means for normalizing the detector circuit to calibrate the same to produce a predetermined amplified signal value when the transducer receives a relatively corresponding predetermined input thereby to block relatively steady-state DC errors from the measuring circuit, said means for normalizing comprising capacitor means connected in the detector circuit for blocking generally steady-state DC signals therein and selectively operable discharge means for selectively referencing one side of said capacitor means to a predetermined signal value.

2. The improvement of claim 1, wherein the detector circuit includes first and second amplifier stages; and wherein said capacitor means is connected between said amplifier stages, and said discharge means comprises means for discharging the side of said capacitor means in connection with the second amplifier stage to a predetermined signal value thereby to cause the second amplifier stage to produce such predetermined amplified signal value.

3. The improvement of claim 2, wherein said discharge means comprises switch means for selectively coupling said discharge means to a source of such predetermined signal value.

4. The improvement of claim 3, wherein said discharge means includes resistor means for limiting surge currents during discharging of said capacitor means.

5. The improvement of claim 3, further comprising means for automatically closing said switch means to discharge said capacitor means when the transducer receives such relatively corresponding predetermined input.

6. The improvement of claim 2, wherein such predetermined signal value is a relative ground potential and such relatively corresponding predetermined input to the transducer is a zero voltage level.

7. The improvement of claim 6, wherein the transducer comprises a photosensitive detector and such relatively steady-state DC errors are responsive to the dark current flow in such photosensitive detector.

8. The improvement of claim 7, wherein the photosensitive detector comprises a photosensitive transistor.

9. In combination with a transducer for producing a quantifiable electrical signal generally proportionally representative of an input thereto, the transducer comprising a photosensitive detector that produces a dark current when no light is impinging thereon, a detector circuit for amplifying such electrical signal to provide an amplified signal proportionally representative of such electrical signal, and a measuring circuit for measuring such amplified signal to provide an output signal indicative of such input to the transducer, the improvement comprising:
   means for normalizing the detector circuit to calibrate the same to produce a predetermined amplified signal value when the transducer receives a relatively corresponding predetermined input thereby to block relatively steady-state DC errors from the measuring circuit, and means for normalizing including means for causing the detector circuit to produce a relative ground potential as such predetermined amplified signal value when the photosensitive detector receives such no light input as such a corresponding predetermined input.

10. The improvement of claim 9, wherein said means for normalizing comprises a capacitor in the detector circuit.

11. The improvement of claim 10, wherein the detector circuit includes first and second amplifier stages; and wherein said capacitor is connected between the two amplifier stages, and wherein said means for normalizing further comprises discharge circuit means for discharging said capacitor.

12. The improvement of claim 11, wherein said discharge circuit means includes a selectively operable switch means for closing a circuit to discharge the output side of said capacitor coupled to the second amplifier stage to such relative ground potential.

13. The improvement of claim 12, wherein the measuring circuit is sensitive to relatively steady-state DC error and said means for normalizing eliminates such DC error.

14. The improvement of claim 13, wherein the photosensitive detector, circuit and measuring circuit comprise a colorimeter further including a plurality of color filters, and wherein the photosensitive detector measures each of the colors passed by the respective filters, the colorimeter still further including multiplexing means for detecting which color light is being passed to and when light is being blocked from the photosensitive detector, and wherein the multiplexing means closes said switch means in said discharge circuit means to normalize the detector circuit whenever light is blocked from the photosensitive detector.

15. The improvement of claim 14, wherein the photosensitive detector comprises a photosensitive transistor that has a dark current which is variable with respect to the temperature thereof.

* * * * *